US008907835B2

(12) United States Patent
Tanaka

(10) Patent No.: US 8,907,835 B2
(45) Date of Patent: Dec. 9, 2014

(54) A/D CONVERSION CIRCUIT AND SOLID-STATE IMAGE PICKUP DEVICE

(71) Applicants: Olympus Corporation, Tokyo (JP); Denso Corporation, Kariya-shi, Aichi (JP)

(72) Inventor: Takanori Tanaka, Tokyo (JP)

(73) Assignees: Olympus Corporation, Tokyo (JP); Denso Corporation, Kariya-shi (JP)

( * ) Notice: Subject to any disclaimer, the term of this patent is extended or adjusted under 35 U.S.C. 154(b) by 115 days.

(21) Appl. No.: 13/850,817

(22) Filed: Mar. 26, 2013

(65) Prior Publication Data
US 2013/0208160 A1  Aug. 15, 2013

Related U.S. Application Data

(63) Continuation of application No. PCT/JP2011/070938, filed on Sep. 14, 2011.

(30) Foreign Application Priority Data

Sep. 27, 2010  (JP) ................................. 2010-215418

(51) Int. Cl.
| | |
|---|---|
| *H03M 1/12* | (2006.01) |
| *H04N 5/374* | (2011.01) |
| *H03M 1/50* | (2006.01) |
| *H04N 5/378* | (2011.01) |
| *H04N 5/335* | (2011.01) |
| *H03M 1/60* | (2006.01) |

(52) U.S. Cl.
CPC .............. *H04N 5/335* (2013.01); *H04N 5/374* (2013.01); *H03M 1/502* (2013.01); *H03M 1/60* (2013.01); *H04N 5/378* (2013.01); *H03M 1/12* (2013.01); *H03M 1/123* (2013.01)
USPC ............................ 341/166; 341/155; 348/302

(58) Field of Classification Search
CPC .................................. H04N 5/335; H03M 1/12
USPC ........... 341/166, 155, 156, 157; 348/308, 302
See application file for complete search history.

(56) References Cited

U.S. PATENT DOCUMENTS

| | | | | |
|---|---|---|---|---|
| 4,837,632 A | * | 6/1989 | Kubo et al. ................ | 348/208.6 |
| 7,671,317 B2 | * | 3/2010 | Shimomura et al. ....... | 250/208.1 |

FOREIGN PATENT DOCUMENTS

| | | |
|---|---|---|
| JP | 11-177427 A | 7/1999 |
| JP | 2006-287879 A | 10/2006 |

(Continued)

OTHER PUBLICATIONS

Japanese Notice of Allowance dated Oct. 15, 2013, issued in corresponding Japanese Application No. 2010-215418, w/English Translation. (6 pages).

(Continued)

*Primary Examiner* — Jean B Jeanglaude
(74) *Attorney, Agent, or Firm* — Westerman, Hattori, Daniels & Adrian, LLP

(57) ABSTRACT

An A/D conversion circuit may include: a delay circuit that includes a plurality of delay units having a first pulse input terminal, a pulse output terminal, and an analog signal input terminal, wherein each first pulse input terminal of the plurality of delay units is connected to one of the pulse output terminals corresponding to the plurality of delay units, and a pulse output signal input to the first pulse input terminal is delayed in accordance with an analog signal input to the analog signal input terminal and output from the pulse output terminal, and one of the plurality of delay units has a second pulse input terminal to which a pulse signal is input from outside; a state variation detection circuit; and an encoding signal latch circuit.

5 Claims, 17 Drawing Sheets

(56) References Cited

FOREIGN PATENT DOCUMENTS

| JP | 2009-27262 A | 2/2009 |
| JP | 2010-50529 A | 3/2010 |

OTHER PUBLICATIONS

International Search Report for PCT/JP2011/070938, mailing date of Oct. 18, 2011.

\* cited by examiner

FIG. 4

| A | B | O |
|---|---|---|
| Low | Low | Low |
| Low | High | Low |
| High | Low | High |
| High | High | Low |

FIG. 5

| n-th stage | (n+1)th stage | Encoding signals φENC1[1:3] (decimal notation) |
|---|---|---|
| DU[8] | DU[1] | 0 |
| DU[1] | DU[2] | 1 |
| DU[2] | DU[3] | 2 |
| DU[3] | DU[4] | 3 |
| DU[4] | DU[5] | 4 |
| DU[5] | DU[6] | 5 |
| DU[6] | DU[7] | 6 |
| DU[7] | DU[8] | 7 |

FIG. 8

| Delay unit | Output signal |
|---|---|
| DU[1] | Low |
| DU[2] | High |
| DU[3] | High |
| DU[4] | High |
| DU[5] | High |
| DU[6] | Low |
| DU[7] | Low |
| DU[8] | Low |

FIG. 14

| A | B | C | O |
|---|---|---|---|
| Low | Low | Low | Low |
| Low | Low | High | Low |
| Low | High | Low | Low |
| Low | High | High | Low |
| High | Low | Low | Low |
| High | Low | High | Low |
| High | High | Low | High |
| High | High | High | Low |

FIG. 16

| Delay unit | Output signal |
|---|---|
| DU[1] | Low |
| DU[2] | High |
| DU[3] | High |
| DU[4] | High |
| DU[5] | High |
| DU[6] | Low |
| DU[7] | Low |
| DU[8] | High |

A/D CONVERSION CIRCUIT AND SOLID-STATE IMAGE PICKUP DEVICE

CROSS REFERENCE TO RELATED APPLICATIONS

This application is a continuation application based on a PCT Patent Application No. PCT/JP2011/070938, filed Sep. 14, 2011, whose priority is claimed on Japanese Patent Application No. 2010-215418, filed on Sep. 27, 2010, the entire content of which are hereby incorporated by reference.

BACKGROUND OF THE INVENTION

1. Field of the Invention

The present invention relates to an analog/digital (referred to as A/D in the present specification) conversion circuit and a solid-state image pickup device having the A/D conversion circuit that convert an input analog voltage signal to a binary digital signal.

2. Description of the Related Art

Conventionally, in digital cameras, digital video cameras, endoscopes, and the like, a photoelectric conversion device that converts the incident light to an electrical signal is used. With advances in compactness and energy efficiency in digital cameras, video cameras, endoscope, and the like, photoelectric conversion devices are required to be compact and energy efficient. As an approach to achieving compact and energy-efficient photoelectric conversion devices, a photoelectric conversion device incorporating an A/D converter implemented with digital circuitry has been proposed (refer to, for example, Japanese Unexamined Patent Application, First Publication No. 2006-287879).

FIG. 17 shows the general constitution of a photoelectric conversion device in accordance with the related art. The photoelectric conversion device shown in FIG. 17 has a plurality of array blocks (sub-arrays) B1, B2, ... (in FIG. 17 four rows by five columns) that have pixel blocks 90 with a two-dimensional array-like arrangement of pixels having photoelectric conversion elements that output pixel signals in response to the amount of incident light and A/D converters 91 that analog-to-digital convert the pixel signals output from the pixels of the pixel blocks 90.

FIG. 18 shows an example of the circuit configuration of the A/D converter 91 provided in each of the array blocks (sub-arrays) of FIG. 17. In the A/D converter 91 shown in FIG. 18, a plurality of delay units formed by various gate circuits (for example, a NAND gate and a plurality of inverter gates or plurality of buffer circuits) are connected in a ring configuration. In each delay unit within a delay circuit 911 the input signal (voltage) to be analog-to-digital converted is supplied, as the drive voltage of the delay units. Each delay unit within the delay circuit 911 is also supplied with a reference voltage.

In the A/D converter 91 shown in FIG. 18, for example, with the reference voltage of the delay circuit 911 as ground, when a high-level signal is input as the input pulse signal φPL, the input pulse signal φPL passes successively through each delay unit with a delay time responsive to the voltage difference between the input signal and the reference signal (ground), and circulates through the delay circuit 911. When the input pulse signal φPL is made the low level, the input pulse signal φPL stops circulating through the delay circuit 911.

When the input pulse signal φPL is circulating through the delay circuit 911, the number of stages of delay unit that the input pulse signal φPL passes through in a prescribed amount of time is established by the delay time of the delay unit, that is, the voltage difference between the input signal and the reference voltage (ground). A latch circuit 9121 latches signals output from the delay units within the delay circuit 911. An encoder circuit 9122, based on the signals held in the latch circuit 9121, detects the number of stages of delay units that the pulse signal φPL has passed through.

A counter circuit 9120 counts the number of times the input pulse signal φPL circulates within the delay circuit 911. An adder 9123 takes the value output from the counter circuit 9120 as the upper-order bit data (for example, a bits) and takes the value output from the encoder circuit 9122 as the lower-order bit data (for example, b bits) and outputs the digital data of a+b bits. The output value of the adder 9123 is the digital value after analog-to-digital conversion in accordance with the voltage of the input signal. In the photoelectric conversion device shown in FIG. 17, by taking the pixel signals output from the pixel blocks 90 the input signals as the input signal of the A/D converter 91, a digital value responsive to the amount of incident light is output.

In the conventional art, although there is no description of the specific circuit constitution regarding the encoder circuit 9122 shown in FIG. 18, it can be thought of as a combinatorial circuit in which circuits are provided for the number bits in accordance with the number of signals held by the latch circuit 9121 (that is, the number of delay units within the delay circuit 911) and that performs encoding by making the value of each of the bits either 0 or 1, in accordance with the logical state of the signals held by the latch circuit 9121. For this reason, it is necessary to provide a number of input circuits in the encoder circuit 9122 that is the same as the number of signals held by the latch circuit 9121. In this type of circuit configuration, however, the circuit scale of the encoder circuit 9122 grows and the size of the A/D converter 91 could become large.

SUMMARY

The present invention provides an A/D conversion circuit and a solid-state image pickup device that achieve compactness.

An A/D conversion circuit in accordance with a preferred embodiment of the present invention may include: a delay circuit that includes a plurality of delay units having a first pulse input terminal, a pulse output terminal, and an analog signal input terminal wherein each first pulse input terminal of the plurality of delay units is connected to one of the pulse output terminals corresponding to the plurality of delay units, and a pulse output signal input to the first pulse input terminal is delayed in accordance with an analog signal input to the analog signal input terminal and output from the pulse output terminal and one of the plurality of delay units has a second pulse input terminal to which a pulse signal is input from outside; a state variation detection circuit that successively compares pulse output signals from two continuous delay units the plurality of delay units and that, when the states are different between the two pulse output signals, outputs a state variation detection signal; and an encoding signal latch circuit that latches the encoding signal when an encoding signal having a state in accordance with a delay unit that has output the pulse output signal to the state variation detecting circuit is input and the state variation detection signal is input.

Preferably, the A/D conversion circuit in accordance with a preferred embodiment of the present invention may further include: a first pulse signal latch circuit that latches and outputs to the state variation detection circuit one of the pulse output signals from the two continuous delay units.

Preferably, the A/D conversion circuit in accordance with a preferred embodiment of the present invention may further include: a second pulse signal latch circuit that latches and outputs the signal to the state variation detection circuit the other of the pulse output signals from the two continuous delay units.

Preferably, in the A/D conversion circuit in accordance with a preferred embodiment of the present invention, the state variation detection circuit may successively compare pulse output signals from three continuous delay units including two continuous delay units.

A solid-state image pickup device in accordance with a preferred embodiment of the present invention may include: a pixel unit and has a plurality of pixels that have photoelectric conversion elements and are disposed in a matrix arrangement; and the A/D conversion circuit according to claim 1, wherein an analog signal output from pixels disposed in the same column of the plurality of pixels is input to the analog signal input terminal.

According to a preferred embodiment of the present invention, a state variation detection circuit successively compares two continuous pulse output signals of the plurality of delay units and, when the states are different between the two pulse output signals, outputs a state variation detection signal, the encoding signal latch circuit latching the encoding signal when the state variation detection signal is input, thereby enabling encoding without the need to provide a number of input circuits that is the same as the number of delay units. For this reason, the A/D conversion circuit and the solid-state image pickup device that incorporates the A/D conversion circuit can be made compact.

BRIEF DESCRIPTION OF THE DRAWINGS

FIG. 4 is a reference diagram illustrating contents of a truth table prescribing an operation of a state variation detection circuit in accordance with the first preferred embodiment of the present invention;

FIG. 5 is a reference diagram illustrating contents of a table describing a relation between the number of stages of delay units that output signal to the state variation detection circuit 47 and an encoding signal in accordance with the first preferred embodiment of the present invention;

FIG. 8 is a reference diagram illustrating an output signal of a delay unit in accordance with the first preferred embodiment of the present invention;

FIG. 14 is a reference diagram illustrating contents of a truth table prescribing an operation of a state variation detection circuit in accordance with the fourth preferred embodiment of the present invention;

FIG. 16 is a reference diagram illustrating an output signal of a delay unit in accordance with the fourth preferred embodiment of the present invention;

DESCRIPTION OF THE PREFERRED EMBODIMENTS

Preferred embodiments of the present invention will be described below, with references made to the drawings.

First Preferred Embodiment

Figure 1:
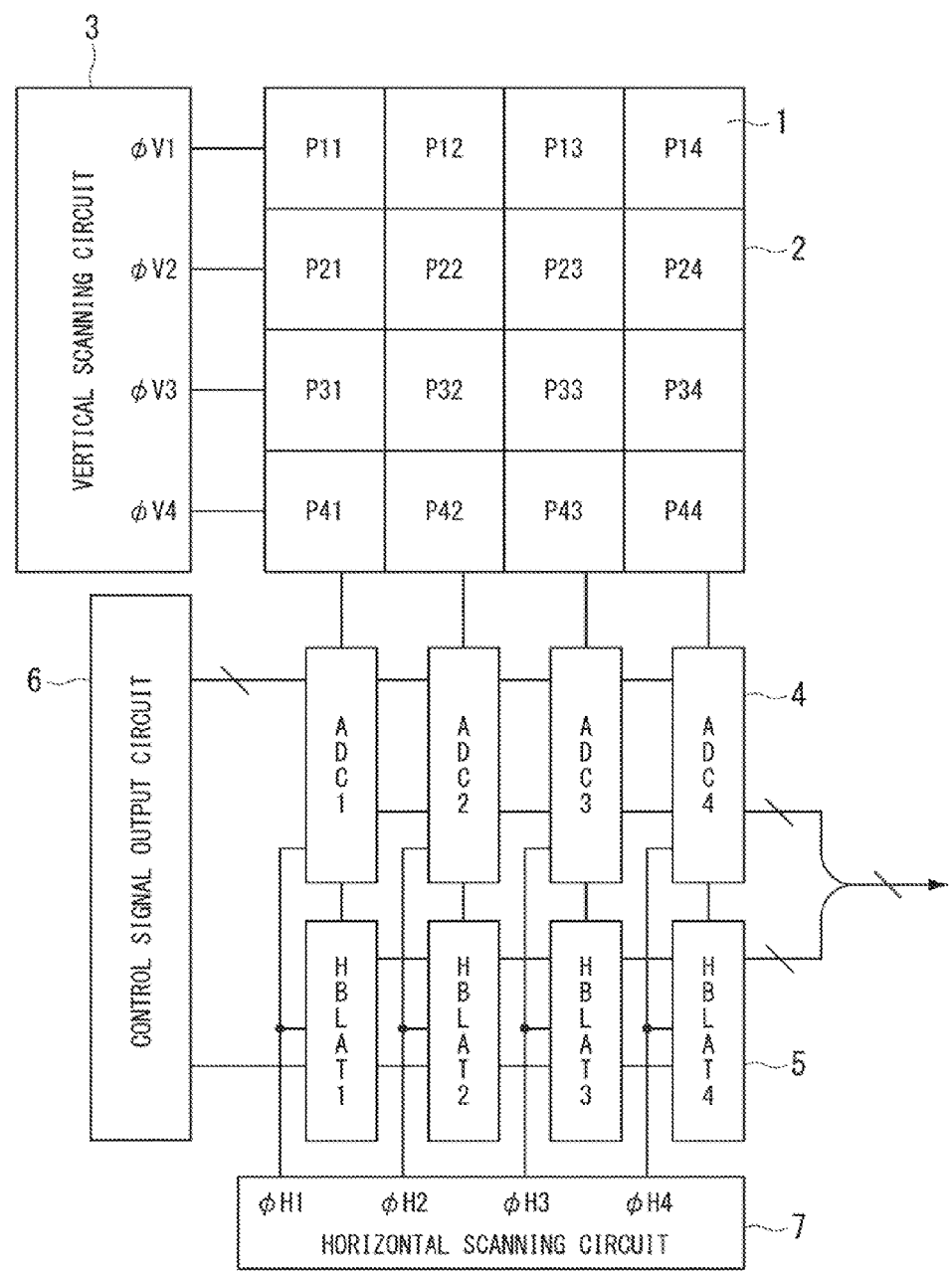
FIG. 1 is a block diagram illustrating a constitution of a solid-state image pickup device in accordance with the first preferred embodiment of the present invention.

A first preferred embodiment of the present invention will first be described. FIG. 1 shows the constitution of a solid-state image pickup device in accordance with the first preferred embodiment of the present invention. The solid-state image pickup device shown in FIG. 1 includes a pixel array 2 that has pixels 1, a vertical scanning circuit 3, A/D conversion circuits 4 (ADC1, ADC2, ADC3, ADC4), upper-order bit latch circuits 5 (HBLAT1, HBLAT2, HBLAT3, HBLAT4), a control signal output circuit 6, and a horizontal scanning circuit 7.

The pixel array 2 includes, in a two-dimensional arrangement (four rows and four columns in the illustrated example), pixels 1 (P11, P12, P13, P14, P21, P22, P23, P24, P31, P32, P33, P34, P41, P42, P43, P44) that minimally have photoelectrical conversion elements and that output a pixel signal φPIX1 responsive to the amount of incident light. The vertical scanning circuit 3 performs row selection in the pixel array 2.

The A/D converters 4 are disposed at each column of the pixel array 2 and analog-to-digital convert the pixel signal φPIX1 read from the pixels 1. The A/D converters 4 for each pixel column are ADC1, ADC2, ADC3, and ADC4.

The upper-order bit latch circuits 5 hold the upper-order bit signal of the A/D conversion results of the A/D converters 4. The upper-order bit latch circuits 5 for each pixel column are HBLAT1, HBLAT2, HBLAT3, and HBLAT4.

The control signal output circuit 6 outputs signals that control the A/D converters 4 and the upper-order bit latch circuits 5. The horizontal scanning circuit 7 controls the A/D converters 4 and the upper-order bit latch circuits 5, and outputs a binary digital signal for each column held by the A/D converters 4 and the upper-order bit latch circuits 5.

Figure 2:
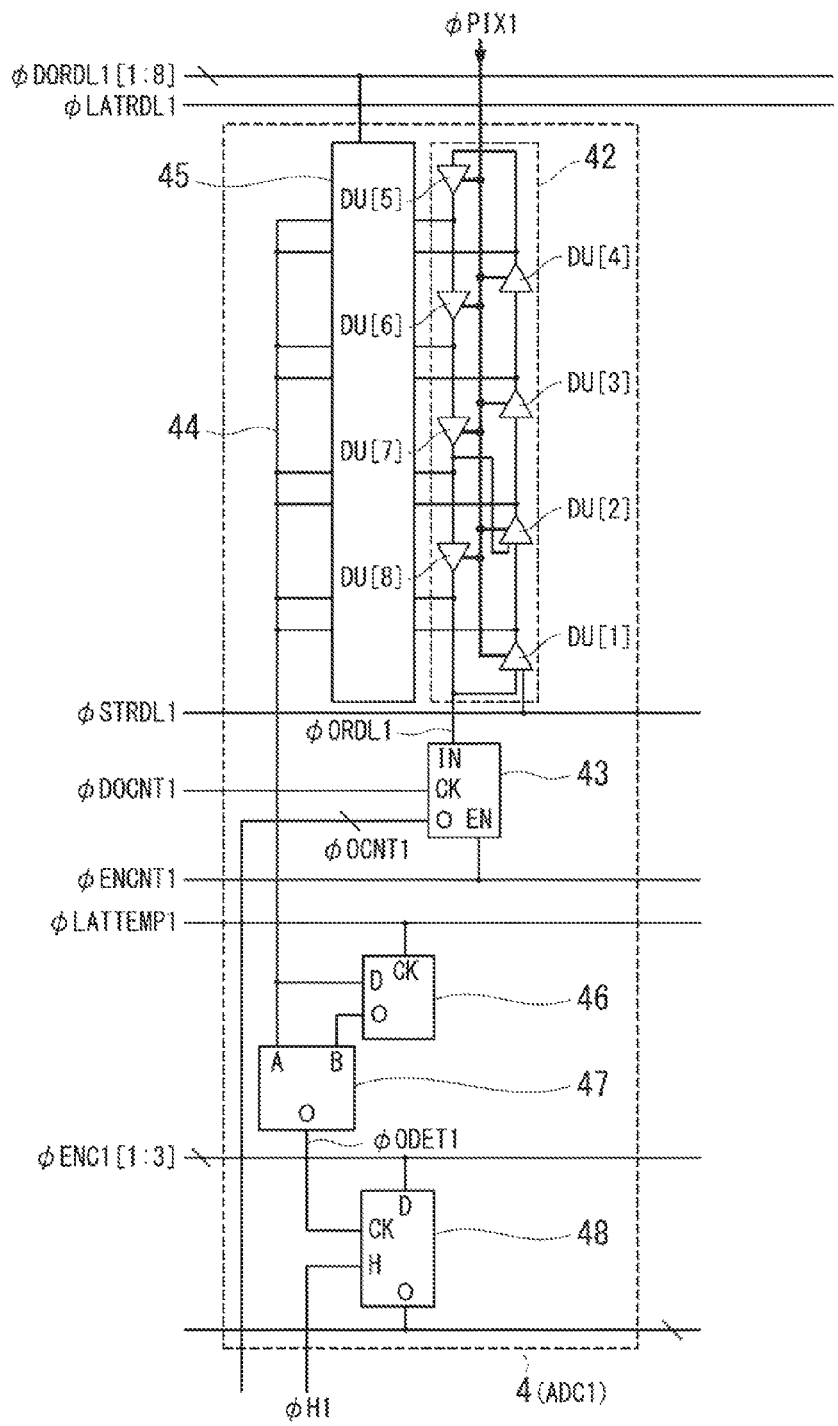
FIG. 2 is a block diagram illustrating a constitution of an A/D converter in accordance with the first preferred embodiment of the present invention.

FIG. 2 shows the constitution of the A/D converter 4. Although FIG. 2 shows the A/D converter 4 for one row (ADC1), the constitution of the other A/D converters 4 (ADC2, ADC3, and ADC4) is the same. The A/D converter 4 is constituted by a delay circuit 42, a counter circuit 43, a latch circuit 45, a pulse signal latch circuit 46, a state variation detection circuit 47, and an encoding signal latch circuit 48.

The delay circuit 42 is constituted by a plurality of delay units DU[1] to DU[8], the delay times of which vary in accordance with the power supply voltage, and which are arranged in a ring configuration. The delay units DU[1] to DU[8] include a pulse input terminal to which a pulse is input, a pulse output terminal that outputs a pulse, and a power supply terminal. The pulse input terminal is connected to the pulse output terminal of the previous stage of delay unit, and the pulse output terminal is connected to the pulse input terminal of the next stage of delay unit. The pulse output terminal of the delay unit DU[8] is connected to the pulse output terminal of the delay unit DU[1], the delay units DU[1] to DU[8] being connected in a ring configuration. The delay units DU[1], to DU[8] delay and output from the pulse output terminal thereof the pulse input to the pulse input terminals thereof. The delay unit DU[1] has a second pulse input terminal to which a start pulse φSTRDL1 is input. The pixel signals φPIX1 output from the pixel, array 2 is connected to the power supply terminals of the delay units DU[1] to DU[8], and the delay circuit 42 outputs a clock signal φORDL1 having a frequency that is responsive to the size of the pixel signal φPIX1.

The counter circuit 43 counts the clock signal φORDL1 output by the delay circuit 42 and outputs to the upper-order bit latch circuit 5 the count value φOCNT1 in accordance with the output control signal φDOCNT1. The latch circuit 45 holds the output signals of each of the delay units DU[1] to DU[8] in accordance with the latch control signal φLATRDL1 and, in accordance with the output control signals φDORL1[n] (n=1, 2, ..., 8), outputs to a signal transfer line 44 the held output signal of the n-th stage delay unit DU[n].

The pulse signal latch circuit 46 holds the output signals of the delay units DU[1] to DU[8] output by the latch circuit 45. The state variation detection circuit 47 compares the signal output to the signal transfer line 44 and the output signal of the pulse signal latch circuit 46, so as to detect a variation in the state between the output signal of the n-th stage delay unit DU[n] and the output signal of the [n+1]th stage delay unit DU[n+1]. The encoding signal latch circuit 48 receives an encoding signal φENC1[1:3] in accordance with the number of the stage of the delay units DU[1] to DU[8] outputting a signal to the state variation detection circuit 47, and holds the encoding signal φENC1[1:3] in accordance with the output signal φODET1 of the state variation detection circuit 47.

Figure 3A:
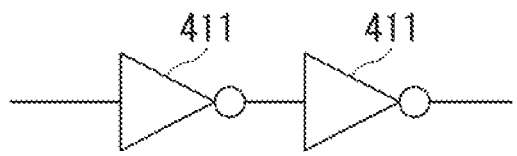
FIG. 3A is a circuit diagram illustrating a constitution of a delay unit in accordance with the first preferred embodiment of the present invention.
Figure 3B:
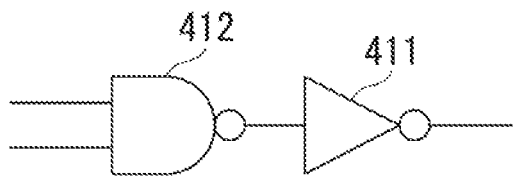
FIG. 3B is a circuit diagram illustrating the constitution of the delay unit in accordance with the first preferred embodiment of the present invention.
Figure 3C:
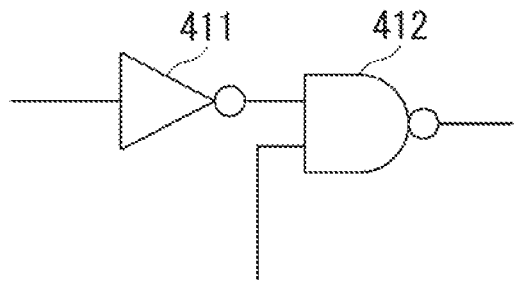
FIG. 3C is a circuit diagram illustrating the constitution of the delay unit in accordance with the first preferred embodiment of the present invention.

The constitutions of the delay units DU[1] to DU[8] are divided into three types as follows. First, there are delay units (DU[3] to DU[8] (the ones other than DU[1] and DU[2]) configured with an inverter circuits 411 connected in series (refer to FIG. 3A); second, there is a delay unit (DU[1]) configured by the series connection of a NAND circuit 412, followed by an inverter circuit 411 (refer to FIG. 3B); and, third, there is a delay unit (DU[2]) configured by the series connection of an inverter circuit 411, followed by the NAND circuit 412 (refer to FIG. 3C). In order to cause the delay unit 42 to oscillate, the output signal of DU[7] is fed back to one of the input terminals of DU[2].

The state variation detection circuit 47 detects the state variation based on the truth table shown in FIG. 4. A table of the relationship between the delay units DU[1] to DU[8] that output signals to the state variation detection circuit 47 and the encoding signals φECN1[1:3] is shown in FIG. 5.

Figure 6:
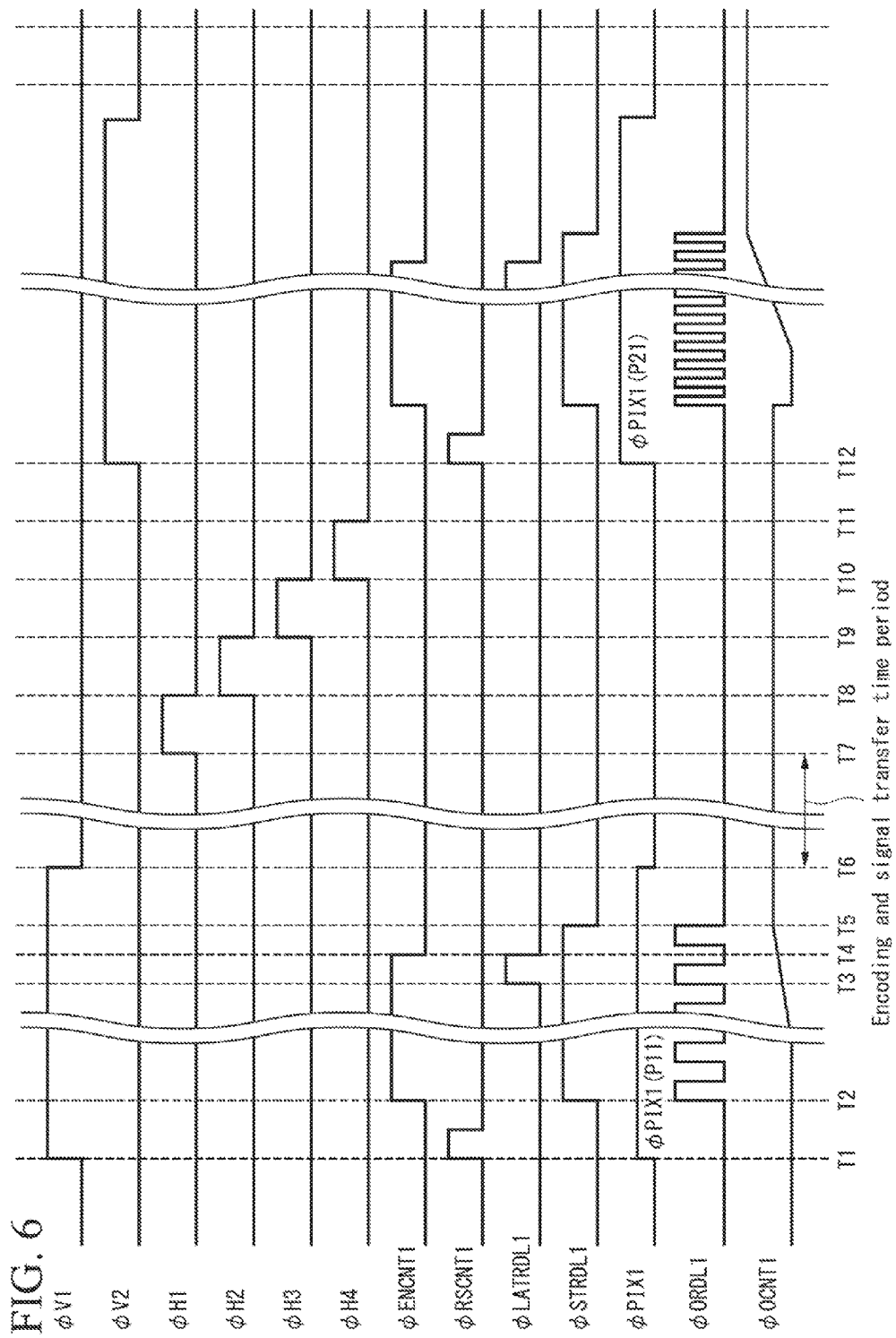
FIG. 6 is a timing chart illustrating an operation of the solid-state image pickup device in accordance with the first preferred embodiment of the present invention.

Next, the operation of the solid-state image pickup device in accordance with the first preferred embodiment will be described, using the timing diagram shown in FIG. 6. With regard to the operation of the A/D converters 4 (ADC1, ADC2, ADC3, and ADC4), only the A/D converter 4 (ADC1) will be described, the description of the operation of the other A/D converters 4 (ADC2, ADC3, and ADC4), which is the same as the operation of the A/D converter 4 (ADC1), being omitted. The signals that control the A/D converters 4 (φENCNT1, φRSCNT1, φLATRDL1, φSTRDL1, φDORDL1[1:8], φLATTEMPT1, φENC1[1:3], and φDOCNT1) and the signal that controls the upper-order bit latch circuit 5 (φLATCNT1) are output from the control signal output circuit 6.

First, at time T1, the pixel selection signal φV1 and counter reset signal φRSCNT1 change to the high level. As a result, the first row of pixels 1 (P11, P12, P13, P14) controlled by the pixel selection signal φV1 is selected, and the pixel signals φPIX1 (P11, P12, P13, and P14) of the pixels 1 (P11, P12, P13, and P14) are each output to the A/D converters 4. Also, the count value φOCNT1 held, by the counter circuit 43 is reset. When this occurs, the other pixel, selection signals φV2, φV3, and φV4 are held at the low level. After that, by the counter reset signal φRSCNT1 changing to the low level, the counter circuit 43 completes the reset operation.

Continuing, at time T2, the start pulse φSTRDL1 and the count enable signal φENCNT1 change to the high level. As a result, the delay circuit 42 outputs a clock signal φORDL1 having a frequency in accordance with the pixel signal φPIX1 (P11), and the counter circuit 43 starts the operation of counting the rising edges of the clock signal φORDL1. The counter circuit 43 may be changed so as to perform the operation of counting the falling edges of the clock signal φORDL1.

Continuing, at time T3, the latch control signal φLATRDL1 changes to the high level, and at time T4 the latch control signal φLATRDL1 and the count enable signal φENCNT1 change to the low level. As a result, simultaneously with the latch circuit 45 holding the output signal from the delay units DU[1] to DU[8] at time T4, the counter circuit 43 ends the operation of counting the clock signal φORDL1.

Continuing, at time T5, when the start pulse φSTRDL1 changes to the low level, the delay circuit 42 stops outputting the clock signal φORDL1. Continuing, at time T6, by the pixel selection signal φV1 changing to the low level, the pixels 1 of the first row go into the non-selected state. After time T6 is an encoding and signal transfer time period.

Figure 7:
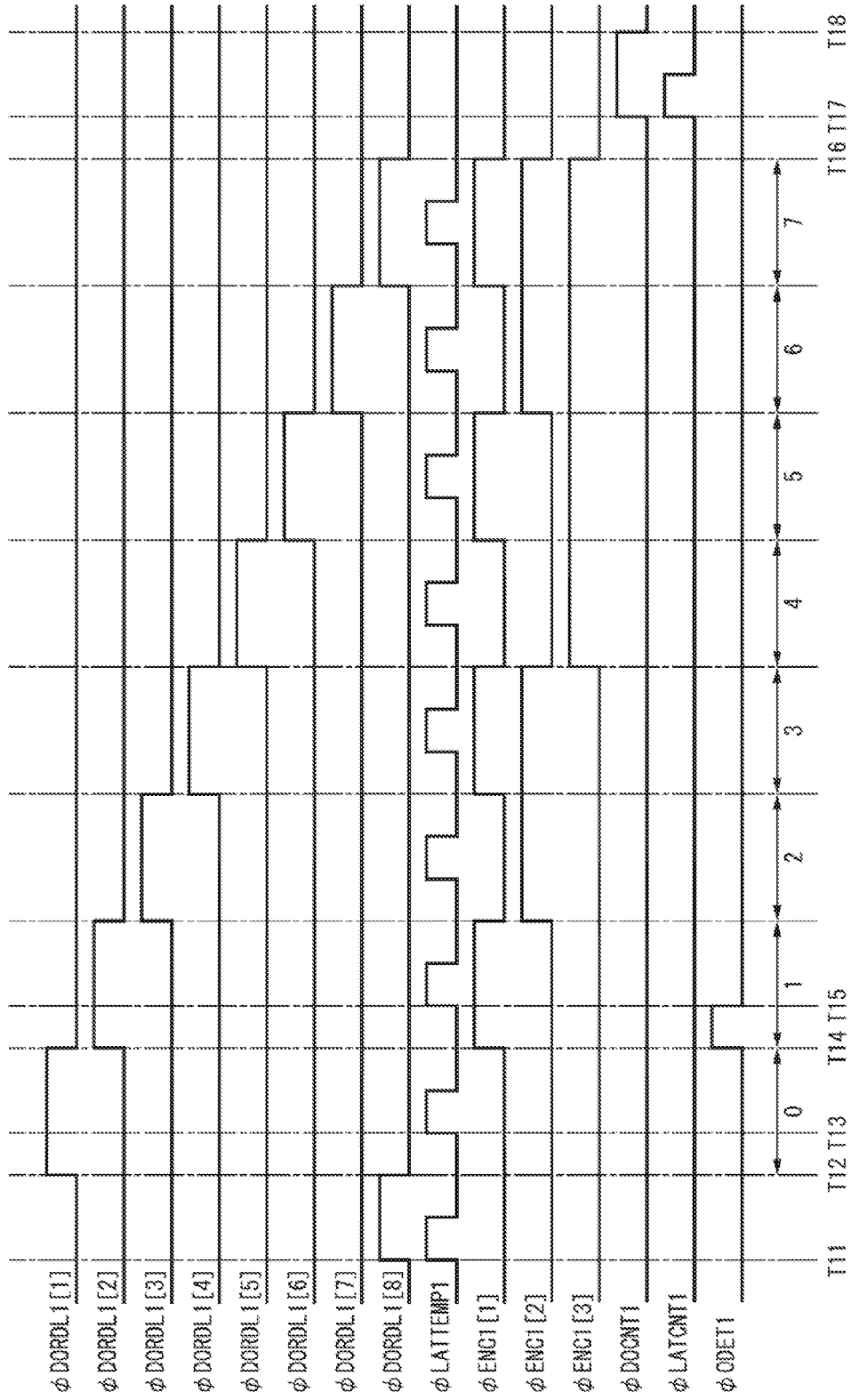
FIG. 7 is a timing chart illustrating an operation of the A/D converter in accordance with the first preferred embodiment of the present invention.

Next, the operation related to the encoding and signal transfer time period will be described, using the timing diagram shown in FIG. 7. This description assumes that the output signals of the delay units DU[1] to DU[8] held by the latch circuit 45 were the values shown in the table of FIG. 8.

First, at time T11, simultaneously with the output control signal φDORDL1[8] and the latch signal φLATTEMPT1 changing to the high level, the encoding signals φENC[1:3] change to 0(10), where n(10) indicates n in decimal notation. As a result, the output signal of the eighth-stage delay unit DU[8] held by the latch circuit 45 is output to the signal transfer line 44, and the pulse signal latch circuit 46 captures the output signal of the delay unit DU[8]. After that, by the latch signal φLATTEMPT1 changing to the low level, the pulse signal latch circuit 46 holds the output signal of the delay unit DU[8].

Continuing, at time T12, simultaneously with the output control signal φDORDL1[8] changing to the low level, the output control signal φDORDL1[1] changes to the high level. As a result, the output signal of the first-stage delay unit DU[1] is output to the signal transfer line 44. When this occurs, the output signal of the first-stage DU[1] and the output signal of the eight-stage DU[8] are input to the input terminals A and B, respectively, of the state variation detection circuit 47. As shown in FIG. 7, because the output signal of the delay unit DU[1] and the output signal of the delay unit DU[8] are at the low level, the state variation detection circuit 47 outputs the low level.

Continuing, at time T13, the latch signal φLATTEMPT1 changes to the high level. As a result, the pulse signal latch circuit 46 captures the output signal of the delay unit DU[1]. After that, by the latch signal φLATTEMPT1 changing to the low level, the pulse signal latch circuit 46 holds the output signal of the delay unit DU[1]. When this occurs, because the same signal is input to the input terminals A and B of the state variation detection circuit 47, the state variation detection circuit 47 outputs the low-level.

Continuing, at time T14, simultaneously with the output control signal φDORDL1[1] changing to the low level and the output control signal φDORDL[2] changing to the high level, the encoding signal φENC[1:3] changes to 1(10). As a result, the output signal of the second-stage delay unit DU[2] is output to the signal transfer line 44. When this occurs, the output signal of the second-stage delay unit DU[2] and the output signal of the first-stage delay unit DU[1] are input, respectively, to the input terminals A and B of the state variation detection circuit 47. When this occurs, the state variation detection circuit 47 outputs the high level. For this reason, the encoding signal latch circuit 48 captures the encoding signal φENC1[1:3]=1(10).

Continuing, at time T15, the latch signal φLATTEMP1 changes to the high level. As a result, the pulse signal latch circuit 46 captures the output signal of the delay unit DU[2]. After that, by the latch signal φLATTEMPT1 changing to the low level, the pulse signal latch circuit 46 holds the output signal of the delay unit DU[2]. When this occurs, because the same signal is input to the input terminals A and B of the state variation detection circuit 47, the state variation detection circuit 47 outputs the low level. For this reason, the encoding signal latch circuit 48 holds the encoding signal φENC1[1:3]=1(10).

After this, in the same manner, up until time T16, the output signal of the n-th stage delay unit DU[n] and the output signal of the (n+1)th stage delay unit DU[n+1] are successively compared. When this is done, because the state variation detection circuit 47 does not detect a state variation, the encoding signal latch circuit 48 continues to hold the encoding signal φENC1[1:3]=1(10).

Continuing, at time T17, the output control signal φDOCNT1 and the latch control signal φLATCNT1 change to the high level. As a result, simultaneously with the counter circuit 43 outputting the count value φOCNT1, the upper-order bit latch circuit 5 captures the output signal of the counter circuit 43. After that, by the latch control signal φLATCNT1 changing to the low level, the upper-order bit latch circuit 5 holds the output signal of the counter circuit 43. The above-noted operation completes the operation for the encoding and signal transfer time period.

Next, the operation at time T7 and thereafter will be described, using the timing diagram of FIG. 6. At time T7, when the column selection signal φH1 changes to the high level, the A/D conversion result of the pixel signal φPIX1 (P11) that is held by the A/D converter 4 (ADC1) and the upper-order bit latch circuit 5 (HBLAT1) is output. After that, at times T8, T9, T10, and T11, by successively switching the column selection signals φH2, φH3, and φH4, the reading operation for the first row is completed.

Continuing, at time T12, the row selection signal φV2 changes the high level. As a result, the pixels 1 (P21, P22, P23, P24) of the second row are selected. After that, by performing operations similar to the first row, the operation of reading the second-row pixel signals is completed. Then, with regard to the third and fourth rows, by performing operations similar to the first and second rows, the operation of reading all the pixels is completed.

By the above-described operations, the state variation detection circuit 47 detects a variation of state when, of two continuous delay units, the output signal of the previous stage of delay unit is the low level and the output signal of the following stage of delay unit is the high level, the encoding signal latch circuit 48 holding the encoding signal at that time. Because the state variation detected by the state variation detection circuit 47 corresponds to the position of the pulse of the clock signal φORDL1 that circulates within the delay circuit 42, the encoding signal corresponding to this pulse position is held by the encoding signal latch circuit 48. By doing this, encoding is possible without providing the same number of input circuits as the number of delay units in each pixel column. According to the first preferred embodiment, therefore, it is possible to achieve a compact A/D converter. Also, because a column A/D conversion type solid-state image pickup device needs to have a particularly small column pitch to reduce the surface area of the circuit, by incorporating the A/D converter of the first preferred embodiment in a solid-state image pickup device, an even greater effect can be obtained.

Second Preferred Embodiment

Figure 9:
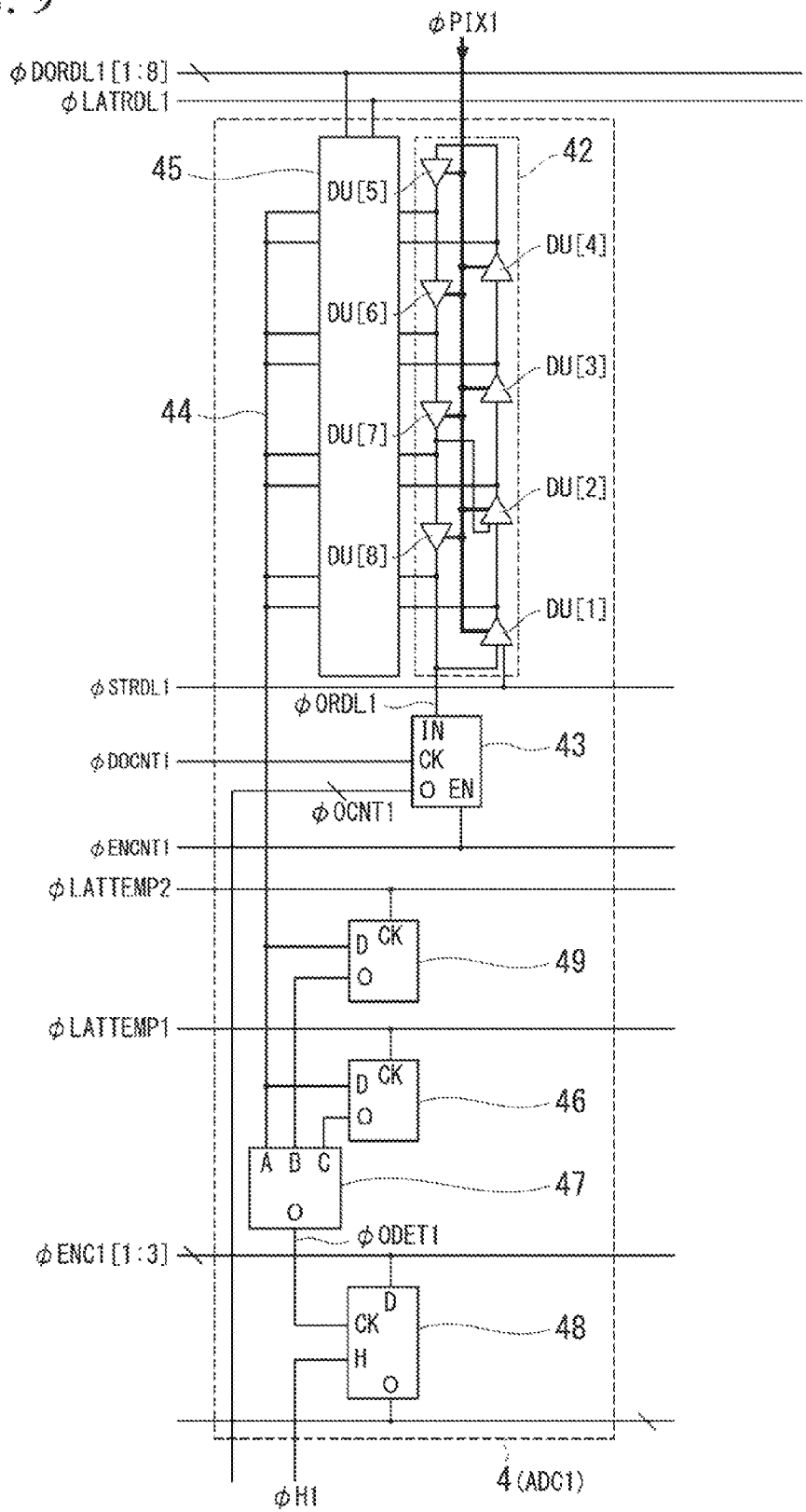
FIG. 9 is a block diagram illustrating a constitution of an A/D converter in accordance with the second preferred embodiment of the present invention.

The second preferred embodiment of the present invention will be described next. FIG. 9 shows the constitution of an A/D converter 4 in accordance with the second preferred embodiment of the present invention. The A/D converter 4 of the second preferred embodiment is different from the A/D converter 4 of the first preferred embodiment with regard to the provision of a pulse signal latch circuit 49. The pulse signal latch circuit 49 has an output terminal O that is connected to the input terminal A of the state variation detection circuit 47 and holds the output signal of the delay unit that is output by the latch circuit 45. Because other features of the constitution are the same as in the solid-state image pickup device of the first preferred embodiment their description will be omitted.

Figure 10:
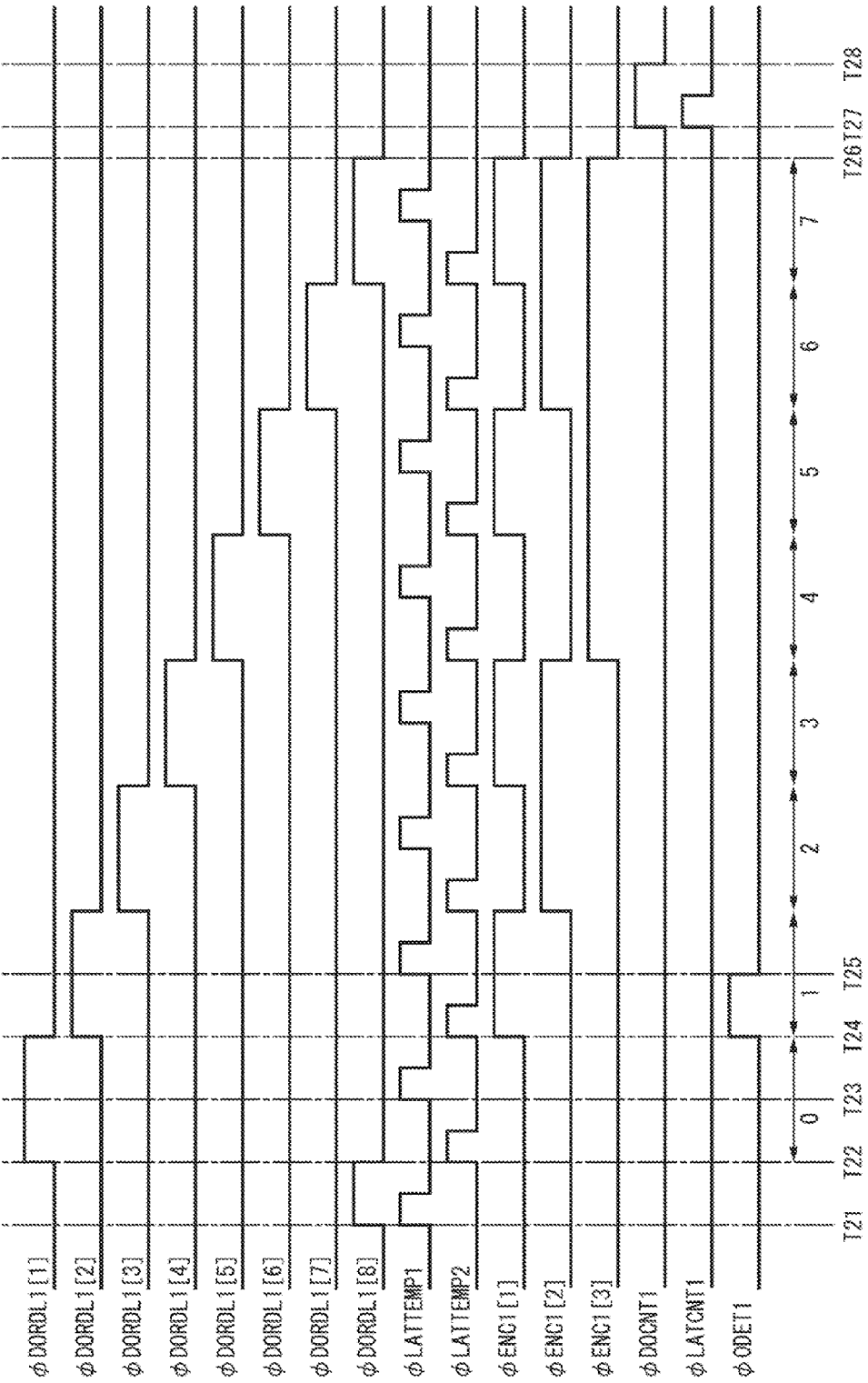
FIG. 10 is a timing chart illustrating an operation of the A/D converter in accordance with the second preferred embodiment of the present invention.

Next, the operation of the solid-state image pickup device in accordance with the second preferred embodiment will be described, using the timing diagram shown in FIG. 10. Because operation other than with regard to the encoding and signal transfer time period is the same as the first preferred embodiment, that operation will not be described. The signals (φDORDL1[1:8], φLATTEMPT1, φLATTEMPT2, φENC1 [1:3], and φDOCNT1) that control the A/D converter 4 and the signal (φLATCNT1) that controls the upper-order bit latch circuit 5 are output from the control signal output circuit 6.

First, at time T21, the output control signal φDORDL1[8] and the latch signal φLATTEMPT1 change to the high level. As a result, the output signal of the eighth-stage delay unit DU[8] holed by the latch circuit 45 is output to the signal transfer line 44, and the pulse signal latch circuit 46 captures the output signal of the delay unit DU[8]. After that, by the latch signal φLATTEMPT1 changing to the low level, the pulse signal latch circuit 46 holds the output signal of the delay unit DU[8].

Continuing, at time T22, simultaneously with the output control signal φDORDL1[8] changing to the low level, and the output control signal φDORDL1[1] and latch signal φLATTEMPT2 changing to the high level, the encoding signal φENC[1:3] changes to 0(10). As a result, the output signal of the first-stage delay unit DU[1] is output to the signal transfer line 44, and the pulse signal latch circuit 49 captures the output signal of the delay unit DU[1]. When this occurs, the output signal of the first-stage delay unit DU[1] and the output signal of the eighth-stage delay unit DU[8] are input to the input terminals A and B, respectively of the state variation detection circuit 47. For this reason, the state variation detection circuit 47 outputs the low level. After that, by the latch signal φLATTEMPT2 changing to the low level, the pulse signal latch circuit 49 holds the output signal of the delay unit DU[1].

Continuing, at time T23 the latch signal φLATTEMPT1 changes to the high level. As a result, the pulse signal latch circuit 46 captures the output signal of the delay unit DU[1]. When this occurs, because the same output signal is input to the input terminals A and B of the state variation detection circuit 47, the state variation detection circuit outputs the low level.

Continuing, at time T24, simultaneously with the output control signal φDORDL1[2] and the latch signal φLATTEMPT2 changing to the high level, the encoding signal φENC[1:3] becomes 1(10). As a result, the output signal of the second-stage delay unit DU[2] is output to the signal transfer line 44 and the pulse signal latch circuit 49 captures the output signal of the delay unit DU[2]. When this occurs, the output signal of the second-stage delay unit DU[2] and the output signal of the first-stage delay unit DU[1] are input, respectively, to the input terminals A and B of the state variation detection circuit 47. For this reason, the state variation detection circuit 47 outputs the high level. When this occurs, the encoding signal latch circuit 48 captures the encoding signal φENC[1:3]=1(10). After that, by the latch signal φLATTEMPT2 changing to the low level, the pulse signal latch circuit 49 holds the output signal of the delay unit DU[2]

Continuing, at time T25, the latch signal φLATTEMPT1 changes to the high level. As a result, the pulse signal latch circuit 46 captures the output signal of the delay unit DU[2]. When this occurs, because the same output signal is input to the input terminals A and B of the state variation detection circuit 47, the state variation detection circuit 47 outputs the low level. For this reason, the encoding signal latch circuit 48 holds the encoding signal φENC[1:3]=1(10).

After this, in the same manner, up until time T26, the output signal of the n-th stage delay unit DU[n] and the output signal of the (n+1)th stage delay unit DU[n+1] are successively compared. When this is done, because the state variation detection circuit 47 does not detect a state variation, the encoding signal latch circuit 48 continues to hold 1(10).

Continuing, at time T27, the output control signal φDOCNT1 and the latch control signal φLATCNT1 change to the high level. As a result, simultaneously with the counter circuit 43 outputting the count value, the upper-order bit latch circuit 5 captures the output signal of the counter circuit 43. After that, by the latch control signal φLATCNT1 changing to the low level, the upper-order bit latch circuit 5 holds the output signal of the counter circuit 43. The above-noted operation completes the operation for the encoding and signal transfer time period.

By the above-described operations, similar to the first preferred embodiment, encoding is possible without providing a number of input circuits that is the same as the number of delay units in each pixel column. Therefore, according to the second preferred embodiment, it is possible to achieve a compact A/D converter. Also, by incorporating the A/D converter of the second preferred embodiment in a solid-state image pickup device, an even greater effect can be obtained.

Third Preferred Embodiment

Figure 11:
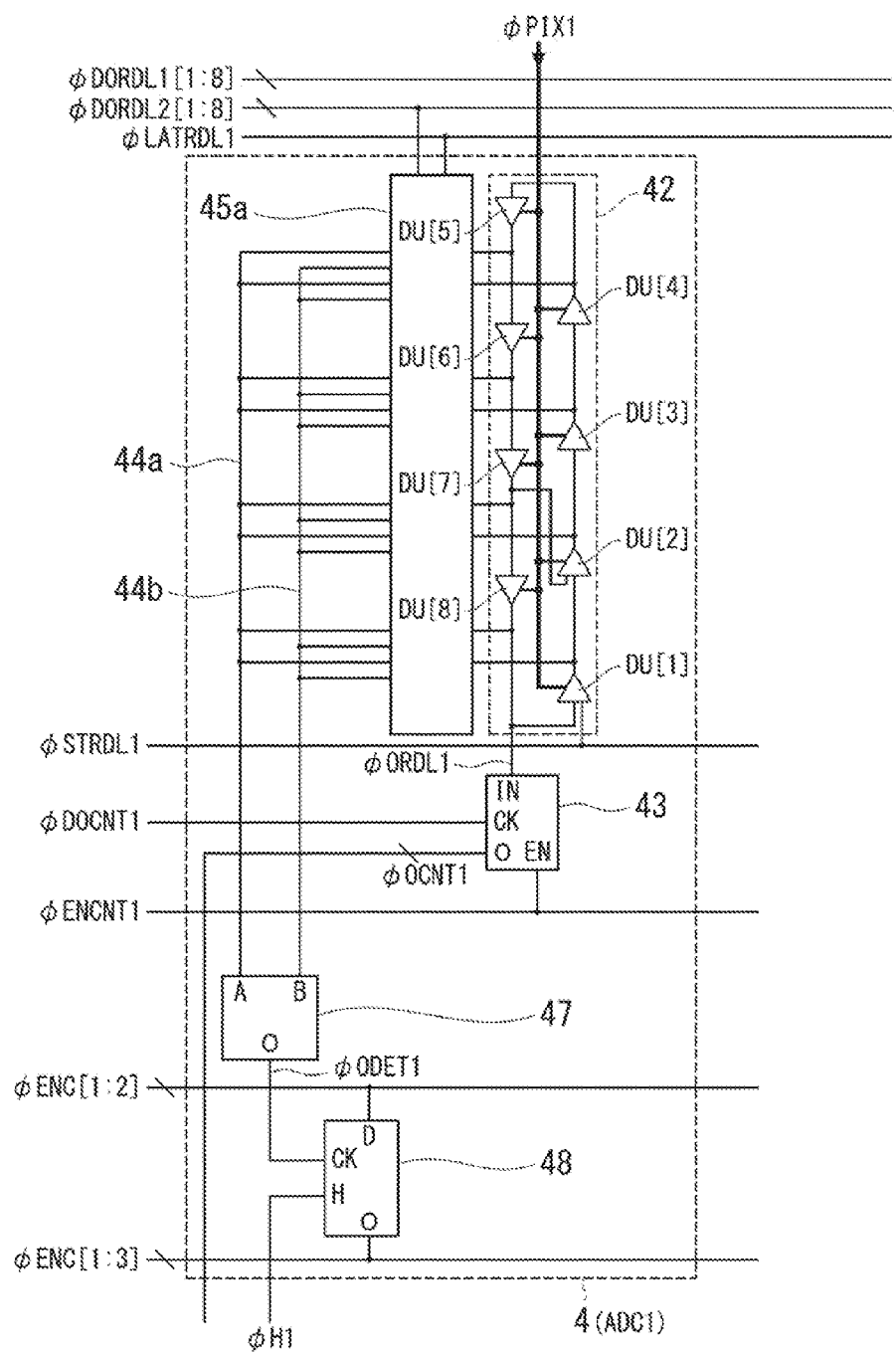
FIG. 11 is a block diagram illustrating a constitution of an A/D converter in accordance with the third preferred embodiment of the present invention.

The third preferred embodiment of the present invention will be described. FIG. 11 shows the constitution of an A/D converter 4 in accordance with the third preferred embodiment of the present invention. The A/D converter 4 of the third preferred embodiment is different with respect to the A/D converter 4 of the first preferred embodiment with regard to the point of provision of a latch circuit 45a outputting the output signal of the n-th stage delay unit DU[n] to the signal transfer line 44a in accordance with the output control signal φDORDL1[n] and outputting the output signal of the n-th stage delay unit DU[n] to the signal transfer line 44b in accordance with the output control signal φDORDL2[n]. Other differences are that the pulse signal latch circuit 46 is not provided, the signal transfer line 44a is connected to the input terminal A of the state variation detection circuit 47 and also that the signal transfer line 44b is connected to the input terminal B thereof. Because the other features of the constitution are the same as the solid-state image pickup device in accordance with the first preferred embodiment, the description thereof will be omitted.

Figure 12:
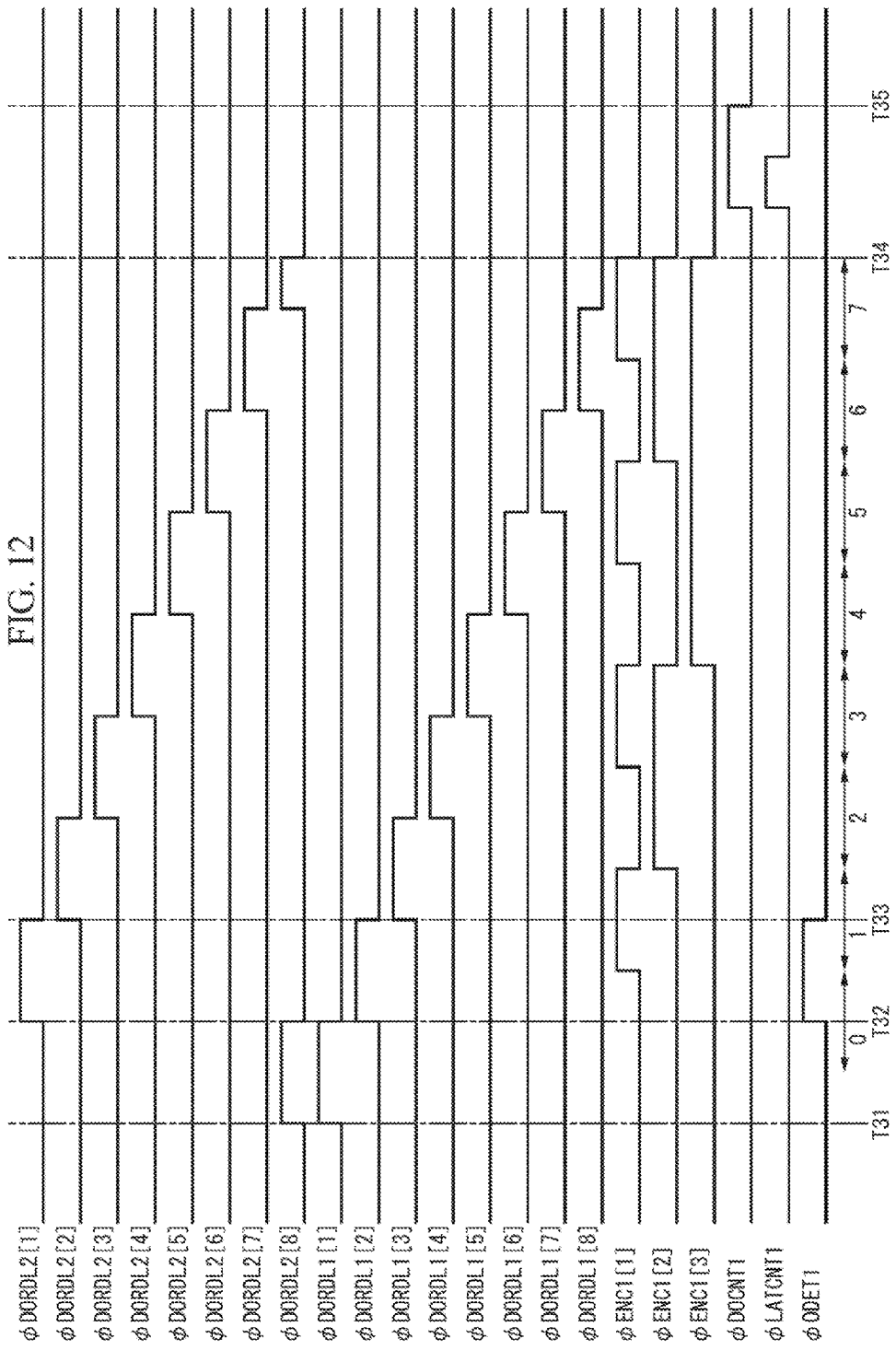
FIG. 12 is a timing chart illustrating an operation of the A/D converter in accordance with the third preferred embodiment of the present invention.

Next, the operation of the solid-state image pickup device in accordance with the third preferred embodiment will be described, using the timing diagram shown in FIG. 12. Because operation other than with regard to the encoding and signal transfer time period is the same as the first preferred embodiment, that operation will not be described. The signals (φDORDL1[1:8], φDORDL2[1:8], φENC1[1:3], and φDOCNT1) that control the A/D converter 4 and the signal that controls the upper-order bit latch circuit 5 (φLATCNT1) are output from the control signal output circuit 6.

First, at time T31, the output control signal φDORDL1[1] and the output control signal φDRODL2[8] change to the high level. As a result, the output signal of the first-stage delay unit DU[1] and the output signal of the eighth-stage delay unit DU[8], which are held by the latch circuit 45a, are output, respectively, to the signal transfer line 44a and the transfer signal line 44b. When this occurs, the output signal of the first-stage delay unit DU[1] and the output signal of the eighth-stage delay unit DU[8] are input, respectively, to the input terminals A and B of the state variation detection circuit 47. For this reason, the state variation detection circuit 47 outputs the low level After that, the encoding signal φENC[1: 3] becomes 0(10).

Continuing, at time T32, the output control signal φDORDL1[2] and the output control signal φDORDL2[1] change to the high level. As a result, the output signal of the second-stage delay unit DU[2] is output to the signal transfer line 44a and the output signal of the first-stage delay unit DU[1] is output to the signal transfer line 44b. When this occurs, the output signal of the second-stage delay unit DU[2] and the output signal of the first-stage delay unit DU[1] are input, respectively, to the input terminals A and B of the state variation detection circuit 47. For this reason, the state variation detection circuit 47 outputs the high level. After that the encoding signal φENC[1:3] becomes 1(10). As a result, the encoding signal latch circuit 48 captures the encoding signal φENC[1:3]=1(10).

Continuing, at time T33, the output control signal φDORDL1[3] and the output control signal φDORDL2[2] change to the high level. As a result, the output signal of the third-stage delay unit DU[3] is output to the signal transfer line 44a, the output signal of the second-stage delay unit DU[2] is output to the signal transfer line 44b. When this occurs, the output signal of the third-stage delay unit DU[3] and the output signal of the second-stage delay unit DU[2] are input, respectively, to the input terminals A and B of the state variation detection circuit 47. For this reason, the state variation detection circuit 47 outputs the low level. When this occurs, the encoding signal latch circuit 48 holds the encoding signal φENC[1:3]=1(10).

After this, in the same manner, up until time T34, the output signal of the n-th stage delay unit DU[n] and the output signal of the (n+1)th stage delay unit DU[n+1] are successively compared. When this is done, because the state variation detection circuit 47 does not detect a state variation, the encoding signal latch circuit 48 continues to hold 1(10).

Continuing, at time T35, the output control signal φDOCNT1 and the latch, control signal φLATCNT1 change to the high level. As a result, simultaneously with the counter circuit 43 outputting the count value, the upper-order bit latch circuit 5 captures the output signal of the counter circuit 43. After that, by the latch control signal φLATCNT1 changing to the low level, the upper-order bit latch circuit 5 holds the output signal of the counter circuit 43. The above-noted operation completes the encoding and signal transfer time period.

By the above-described operations, similar to the first preferred embodiment, encoding is possible without providing a number of input circuits that is the same as the number of delay units in each pixel column. Additionally, compared with the first preferred embodiment, because the pulse signal latch circuit 46 is not provided, it is possible to achieve greater compactness, and shorten the encoding and signal transfer time period. Therefore, according to the third preferred embodiment, it is possible to achieve an A/D converter that is not only compact, but that also enables high-speed encoding. Also, by incorporating the A/D converter of the third preferred embodiment in a solid-state image pickup device, an even greater effect can be obtained.

Fourth Preferred Embodiment

Figure 13:
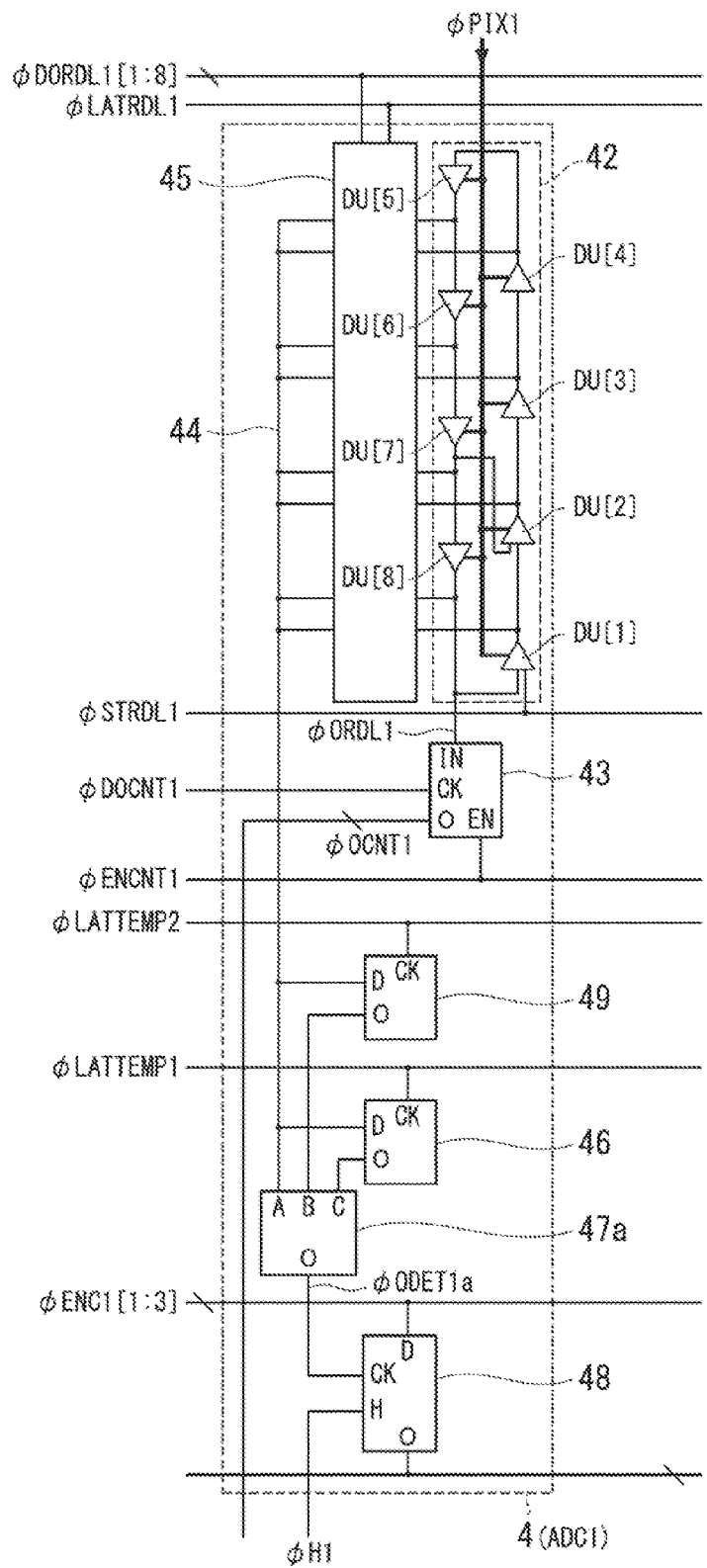
FIG. 13 is a block diagram illustrating a constitution of an A/D converter in accordance with the fourth preferred embodiment of the present invention.

Next, the fourth preferred embodiment of the present invention will be described. FIG. 13 shows the constitution of an A/D converter 4 in accordance with the fourth preferred embodiment of the present invention. The A/D converter of the fourth preferred embodiment is different with respect, to the A/D converter 4 of the second preferred embodiment with regard to the point of in detecting a state variation between the output signal of the n-stage delay unit DU[n] and the output signal of the (n+1)th stage delay unit DU[n+1] a state variation detection circuit 47a is provided, that uses these output signals and also the value of the output signal of the (n+2)th stage delay unit DU[n+2]. The signal transfer line 44, the output terminal O of the pulse signal latch circuit 49, and the output terminal O of the pulse signal latch circuit 46 are connected, respectively, to the input terminals A, B, and C of the state variation detection circuit 47a. The state variation detection circuit 47a detects the state variation based on the truth table shown in FIG. 14.

Figure 15:
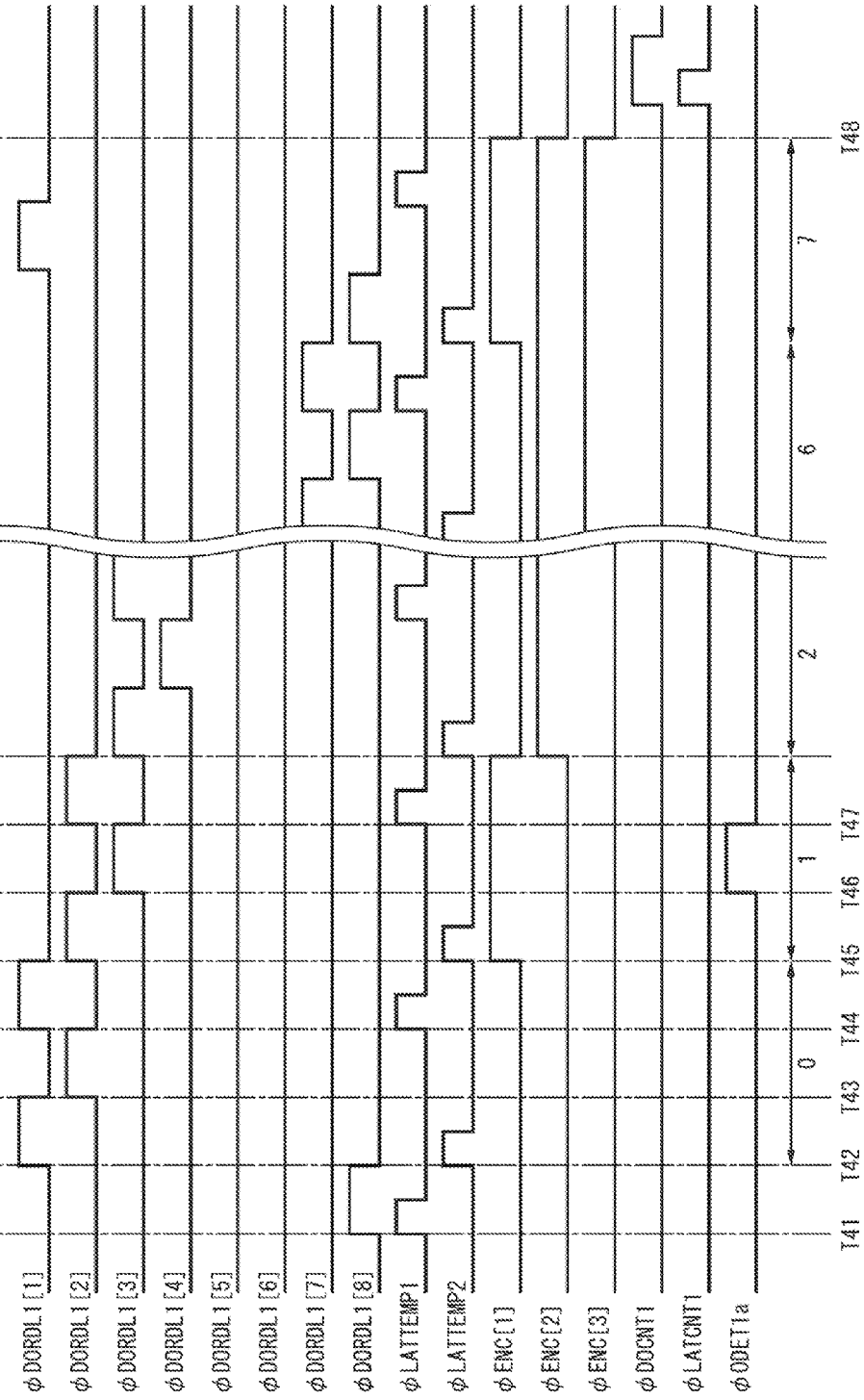
FIG. 15 is a timing chart illustrating an operation of the A/D converter in accordance with the fourth preferred embodiment of the present invention.
Figure 17:
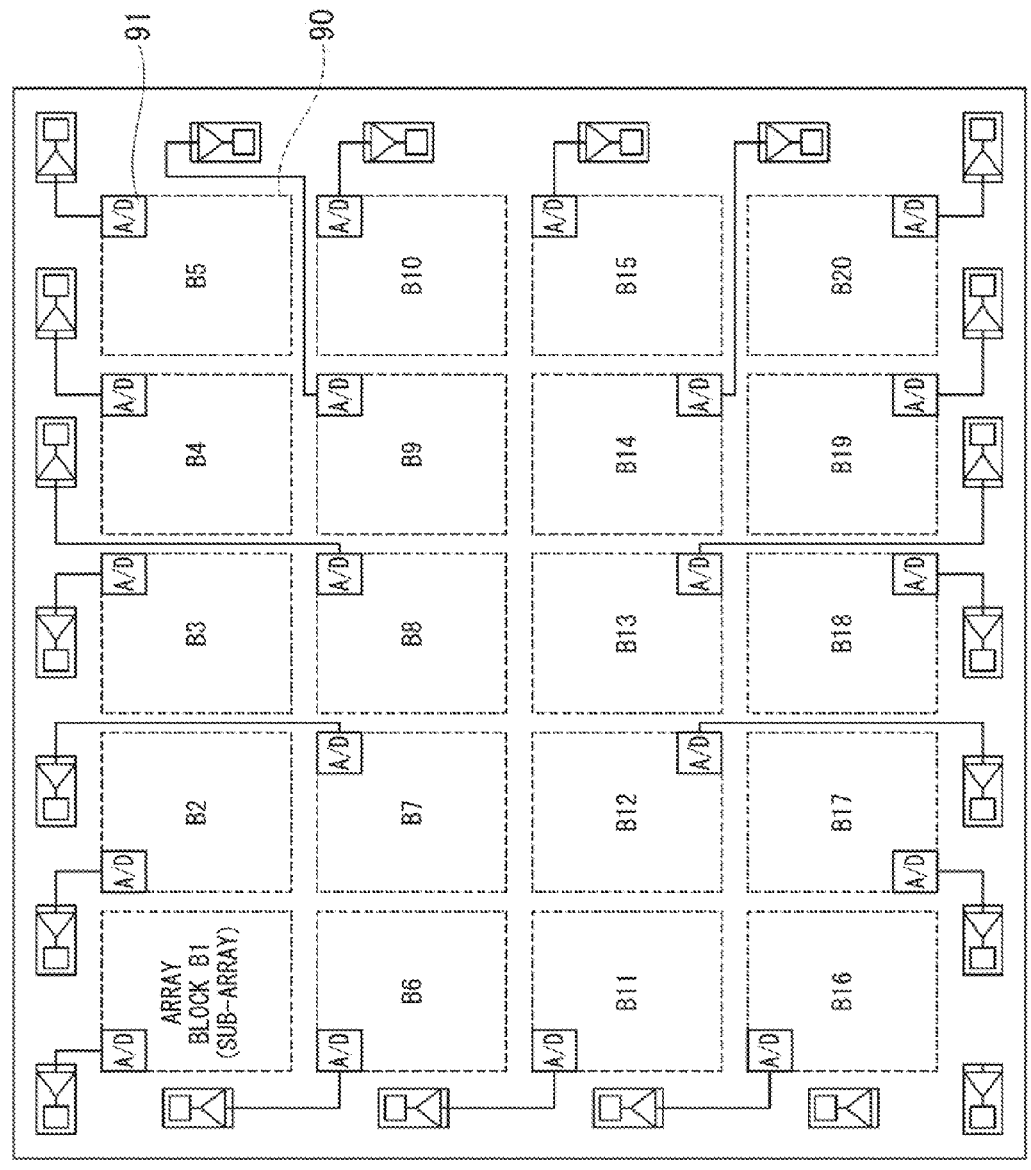
FIG. 17 is a block diagram illustrating a general constitution of a photoelectric conversion device in accordance with the related art.
Figure 18:
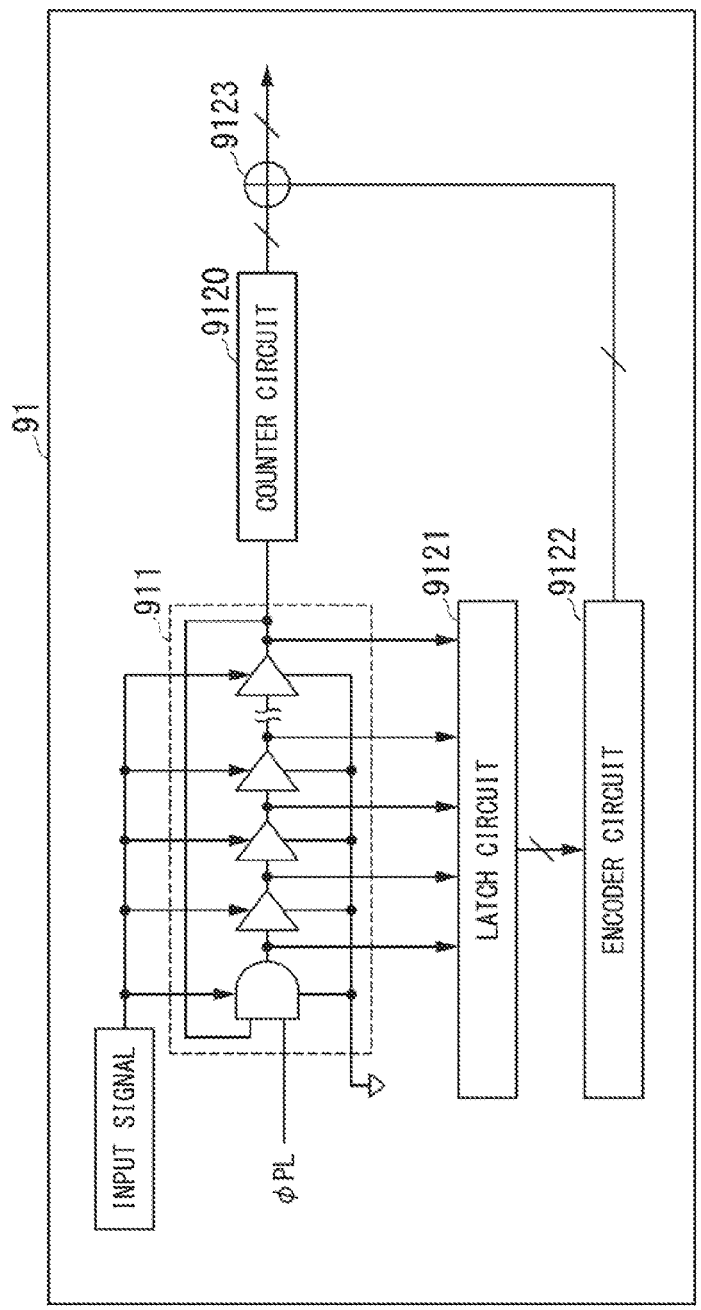
FIG. 18 is a block diagram illustrating a circuit configuration of an A/D converter included in the photoelectric conversion device in accordance with the related art.

Next, the operation of the solid-state image pickup device in accordance with the fourth preferred embodiment will be described, using the timing diagram shown in FIG. 15. Because operation other than the encoding and signal transfer time period is the same as the first preferred embodiment, the description thereof will be omitted. The signals that control the A/D converters 4 (φDORDL1[1:8], φLATTEMP1, φLATTEMPT2, φENC1[1:3], and φDOCNT1) and the signal that controls the upper-order bit latch circuit 5 (φLATCNT1) are output from the control signal output circuit 6.

The description will be with the assumption that the output signals of the delay units DU[1] to DU[8] held by the latch circuit 45 had state variations of two or more locations shown in FIG. 16, caused by jitter in the output signals of the delay units DU[1] to DU[8] and control signals. In FIG. 16 the output signal of the delay unit DU[8] being high is taken to be because of the influence of jitter.

First, at time T41, the output control signal φDORL1[8] and the latch signal φLATTEMPT1 change to the high level. As a result, the output signal of the eight-stage delay unit DU[8] held by the latch circuit 45 is output to the signal transfer line 44, and the pulse signal latch circuit 46 captures the output signal of the delay unit DU[8]. After that, by the latch signal φLATTEMP1 changing to the tow level, the pulse signal latch circuit 46 holds the output signal of the delay unit DU[8].

Continuing, at time T42, simultaneously with the output control signal φDORDL1[8] changing to the low level and the output control signal φDORDL1[1] and latch control signal φLATTEMPT2 changing to the high level, the encoding signal φENC[1:3] becomes 0(10). As a result, the output signal of the first-stage delay unit DU[1] output to the signal transfer line 44, and the pulse signal latch circuit 49 captures the output signal of the delay unit DU[1]. After that, by the latch signal φLATTEMP2 changing, to the low level, the pulse signal latch circuit 49 holds the output signal of the delay unit DU[1].

Continuing, at time T43, simultaneously with the output control signal φDORDL1[1] changing to the low level, the output control signal φDORDL1[2] changes to the high level. As a result the output signal of the second-stage delay unit DU[1] is output to the signal transfer line 44. When this occurs, the output signal of the second-stage delay unit DU[2], the output signal of the first-stage delay unit DU[1] and the output signal of the eighth-stage delay unit DU[8] are input, respectively, to the input terminals A, B and C of the state variation detection circuit 47a. For this reason, the state variation detection circuit 47a outputs the low level.

Continuing, at time T44, the output control signal φDORL1[1] and the latch signal φLATTEMP1 change to the high level. As a result, the output signal of the first-stage delay unit DU[1] is output to the signal transfer line 44, and the pulse signal latch circuit 46 captures the output signal of the delay unit DU[1]. After that, by the latch signal φLATTEMP1 changing to the low level, the pulse signal latch circuit 46 holds the output signal of the delay unit DU[1].

Continuing, at time T45, simultaneously with the output control signal φDORDL1[1] changing to the low level the output control signal φDORDL1[2] and the latch signal φLATTEMP2 change to the high level. As a result, the output signal of the second-stage delay unit DU[2] is output to the signal transfer line 44, and the pulse signal latch circuit 49 captures the output signal of the delay unit DU[2]. After that, by the latch signal φLATTEMP2 changing to the low level, the pulse signal latch circuit 49 holds the output signal of the delay unit DU[2].

Continuing, at time T46, simultaneously with the output control signal φDORDL1[2] changing to the low level and the output control signal φDORDL1[3] changing to the high level, the encoding signal φENC[1:3] becomes 1(10). As a result, the output signal of the third-stage delay unit DU[3] is output to the signal transfer line 44. When this occurs, the output signal of the third-stage delay unit DU[3], the output signal of the second-stage delay unit DU[2], and the output signal of the first-stage delay unit DU[1] are input, respectively, to the input terminals A, B and C of the state variation detection circuit 47a. For this reason, the state variation detection circuit 47a outputs the high level. When this occurs, the encoding signal latch circuit 48 captures the encoding signal φENC[1:3]=1(10).

Continuing, at time T47, the output control, signal φDORDL1[2] and the latch, signal φLATTEMP1 change to the high level. As a result, the output signal of the second-stage delay unit DU[2] is output to the signal transfer line 44, and the pulse signal latch circuit 46 captures the output signal of delay unit DU[2]. When this occurs, the output signal of the third-stage delay unit DU[3], the output signal of the second-stage delay unit DU[2] and the output signal of the second-stage delay unit DU[2] are input, respectively to the input terminals A, B and C of the state variation detection circuit 47a. For this reason, the state variation detection circuit 47a outputs the low level. When this occurs, the encoding signal latch circuit 48 holds the encoding signal φENC[1:3]=1(10).

After this, in the same manner, up until time T48, the output signal of the n-th stage delay unit DU[n], the output signal of the (n+1)th stage delay unit DU[n+1] and the output signal of the (n+2)th stage delay unit DU[n+2] are successively compared.

By the above-described operations, by detecting a state variation between the output signals of the three continuous delay units, similar to the first preferred embodiment, encoding is possible without providing a number of input circuits that is the same as the number of delay units in each pixel column. Additionally, even if there are two state variations of the output signals of the delay units DU[1] to DU[8] because of the influence of jitter, it is possible to perform encoding with good accuracy. According to the fourth preferred embodiment, therefore, it is possible to achieve an A/D converter that is compact and also encodes with high accuracy. Also, by incorporating the A/D converter of the fourth preferred embodiment in a solid-state image pickup device, an even greater effect can be obtained.

Although the detail description of the preferred embodiments of the present invention has been made with references made to the drawings, the specific constitution is not limited to the above-described preferred embodiments, and encompasses design changes and the like within the scope of the spirit of the present invention. For example, application of the above-described A/D converter is not limited to a solid-state image pickup device, but is also possible, with the effect of reducing the surface area of the circuit, in other devices incorporating A/D converters. In the first preferred embodiment and the like, the truth table (for example, FIG. 4) that governs the operation of the state variation detection circuit 47 is not limited to the above, but rather it is possible to change appropriately accompanying the change of sequence and the like in which the output signals of the delay circuit are output to tire signal transfer line 44 and the like.

The present invention can be widely applied to an A/D conversion circuits and solid-state image pickup devices having A/D conversion circuits. According to the present invention, it is possible to achieve a compact A/D conversion circuit and solid-state image pickup device.

What is claimed is:

1. An A/D conversion circuit comprising:
   a delay circuit that includes a plurality of delay units having a first pulse input terminal, a pulse output terminal, and an analog signal input terminal, wherein each first pulse input terminal of the plurality of delay units is connected to one of the pulse output terminals corresponding to the plurality of delay units, and a pulse output signal input to the first pulse input terminal is delayed in accordance with an analog signal input to the analog signal input terminal and output from the pulse output terminal, and one of the plurality of delay units has a second pulse input terminal to which a pulse signal is input from outside;
   a state variation detection circuit that successively compares pulse output signals from two continuous delay units the plurality of delay units and that, when the states are different between the two pulse output signals, outputs a state variation detection signal; and
   an encoding signal latch circuit that latches the encoding signal when an encoding signal having a state in accordance with a delay unit that has output the pulse output signal to the state variation detecting circuit is input and the state variation detection signal is input.

2. The A/D conversion circuit according to claim 1, further comprising:
   a first pulse signal latch circuit that latches and outputs to the state variation detection circuit one of the pulse output signals from the two continuous delay units.

3. The A/D conversion circuit according to claim 2, further comprising:
   a second pulse signal latch circuit that latches and outputs the signal to the state variation detection circuit the other of the pulse output signals from the two continuous delay units.

4. The A/D conversion circuit according to claim 1, wherein the state variation detection circuit successively compares pulse output signals from, three continuous delay units including two continuous delay units.

5. A solid-state image pickup device comprising:
   a pixel unit and has a plurality of pixels that have photoelectric conversion elements and are disposed in a matrix arrangement; and
   the A/D conversion circuit according to claim 1, wherein an analog signal output from pixels disposed in the same column of the plurality of pixels is input to the analog signal input terminal.

* * * * *